(12) United States Patent
Jeng et al.

(10) Patent No.: US 9,477,148 B1
(45) Date of Patent: Oct. 25, 2016

(54) POLYMER, METHOD FOR PREPARING THE SAME, AND A PHOTOSENSITIVE RESIN COMPOSITION THEREOF

(71) Applicant: INDUSTRIAL TECHNOLOGY RESEARCH INSTITUTE, Hsinchu (TW)

(72) Inventors: Jyh-Long Jeng, New Taipei (TW); Jeng-Yu Tsai, Chiayi (TW); Wei-Ta Yang, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/721,487

(22) Filed: May 26, 2015

(51) Int. Cl.
*G03F 7/023* (2006.01)
*C08G 73/10* (2006.01)
*G03F 7/038* (2006.01)

(52) U.S. Cl.
CPC ........... *G03F 7/0233* (2013.01); *C08G 73/106* (2013.01); *C08G 73/1007* (2013.01); *C08G73/1039* (2013.01); *C08G 73/1042* (2013.01); *C08G 73/1067* (2013.01); *C08G 73/1078* (2013.01); *C08G 73/1085* (2013.01); *G03F 7/0387* (2013.01)

(58) Field of Classification Search
CPC .. G03F 7/0233; G03F 7/0226; G03F 7/0387; C08G 73/1067; C08G 73/1071; C08G 73/1007; C08G 73/1039; C08G 73/1042; C08G 73/106; C08G 73/1078; C08G 73/1085
USPC .......... 430/191, 192, 193; 528/353; 525/436
See application file for complete search history.

(56) References Cited

U.S. PATENT DOCUMENTS

| | | | |
|---|---|---|---|
| 4,868,271 A | 9/1989 | Dahl et al. | |
| 5,370,988 A | 12/1994 | Manganiello et al. | |
| 5,436,310 A | 7/1995 | Dahl et al. | |
| 5,514,505 A | 5/1996 | Limburg et al. | |
| 5,563,014 A | 10/1996 | Malhotra et al. | |
| 5,599,629 A | 2/1997 | Gardner et al. | |
| 5,599,856 A | 2/1997 | Gardner | |
| 5,741,585 A * | 4/1998 | Harris ................ | C08G 73/1085 428/357 |
| 5,869,229 A | 2/1999 | Okada et al. | |
| 5,919,892 A * | 7/1999 | Hwang ............... | C08G 73/1085 528/220 |
| 5,922,529 A | 7/1999 | Tsuzuki et al. | |
| 6,011,111 A | 1/2000 | Brennan et al. | |
| 6,524,764 B1 | 2/2003 | Tomikawa et al. | |
| 6,548,621 B1 | 4/2003 | Tsai et al. | |
| 6,593,043 B2 | 7/2003 | Suwa et al. | |
| 6,627,701 B2 | 9/2003 | Adedeji et al. | |
| 6,815,491 B2 | 11/2004 | Adedeji et al. | |
| 6,872,777 B2 | 3/2005 | Adedeji et al. | |
| 6,908,964 B2 | 6/2005 | Adedeji et al. | |
| 7,022,765 B2 | 4/2006 | Adedeji et al. | |
| 8,530,133 B2 | 9/2013 | Bell et al. | |
| 2002/0156185 A1 | 10/2002 | Adedeji et al. | |
| 2002/0165317 A1 | 11/2002 | Adedeji et al. | |
| 2003/0036602 A1 | 2/2003 | Adedeji et al. | |
| 2004/0082719 A1 | 4/2004 | Adedeji et al. | |
| 2004/0126693 A1 | 7/2004 | Wang et al. | |
| 2005/0109533 A1 | 5/2005 | Kurashina et al. | |
| 2005/0154130 A1 | 7/2005 | Adedeji et al. | |
| 2005/0282958 A1* | 12/2005 | Jeng ................... | C08K 5/42 524/606 |
| 2006/0004180 A1 | 1/2006 | Itatani | |
| 2011/0046268 A1 | 2/2011 | Wang | |
| 2012/0305484 A1 | 12/2012 | Freeman et al. | |
| 2013/0011651 A1* | 1/2013 | Iizumi ................ | B29C 41/24 428/220 |
| 2013/0136934 A1* | 5/2013 | Iwai ................... | B29C 41/24 428/458 |
| 2013/0279126 A1* | 10/2013 | Chen .................. | B32B 15/08 361/749 |
| 2013/0313710 A1 | 11/2013 | Sun et al. | |
| 2013/0323640 A1 | 12/2013 | Bell et al. | |
| 2015/0000527 A1 | 1/2015 | Lee et al. | |
| 2015/0000528 A1 | 1/2015 | Lee et al. | |

FOREIGN PATENT DOCUMENTS

| | | |
|---|---|---|
| CN | 101568572 A | 10/2009 |
| CN | 101568752 A | 10/2009 |
| EP | 1262509 A | 12/2002 |
| TW | 555787 B | 10/2003 |
| TW | I230842 B | 4/2005 |
| TW | 200538875 A | 12/2005 |
| TW | 201343719 A | 11/2013 |
| WO | WO 2013/018524 A1 | 2/2013 |

OTHER PUBLICATIONS

Hsu et al., "A novel positive photosensitive polybenzoxazole based on a tetrahydropyranyl (THP) protected polyhydroxyamide," Polymer Bulletin, vol. 50, Issue 5-6, Jul. 2003, pp. 295-302.
Hsu et al., "A novel positive photosensitive polybenzoxazole precursor for microelectronic applications," Polymer, vol. 43, Issue 25, 2002 (Available Online Oct. 25, 2002), pp. 6743-6750.
Hsu et al., "Novel Positive-Working and Aqueous-Base-Developable Photosensitive Poly(imide benzoxazole) Precursor," Journal of Polymer Science: Part A: Polymer Chemistry, vol. 42, Issue 23, Dec. 1, 2004 (first published online Oct. 19, 2004), pp. 5990-5998.
Ogura et al., "Photosensitive Polybenzoxazole Based on a Poly(o-hydroxy amide), a Dissolution Inhibitor, and a Photoacid Generator," Journal of Polymer Science: Part A: Polymer Chemistry, vol. 45, Issue 4, Feb. 15, 2007 (first published online Jan. 8, 2007), pp. 661-668.
Tomikawa et al., "Effect of Photo-active Compound Structure on Photosensitivity of Positive Photosensitive Polyimide," High Performance Polymers, vol. 18, No. 5, Oct. 2006, pp. 603-615.
Taiwan Office Action mailed Apr. 6, 2016 for TW Application No. 104116756.

* cited by examiner

*Primary Examiner* — John S Chu

(74) *Attorney, Agent, or Firm* — Birch, Stewart, Kolasch & Birch, LLP

(57) ABSTRACT

A polymer, a method for preparing the same, and a photosensitive resin composition thereof are provided. The polymer has a structure represented by Formula (I):

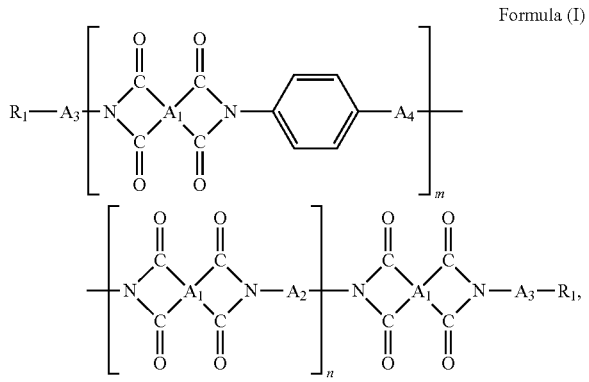

Formula (I)

wherein $R_1$ is —OH, or —COOH; $A_1$ is

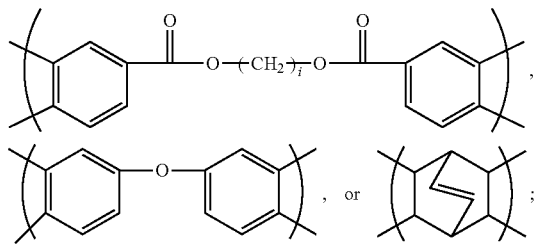

each $A_2$ is independently

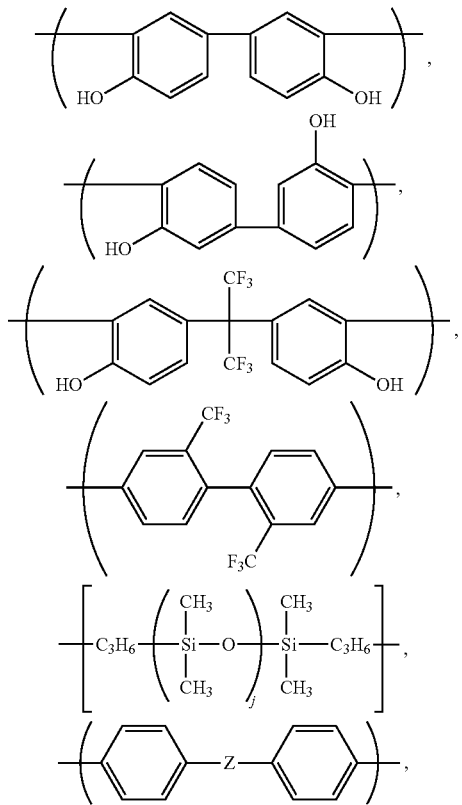

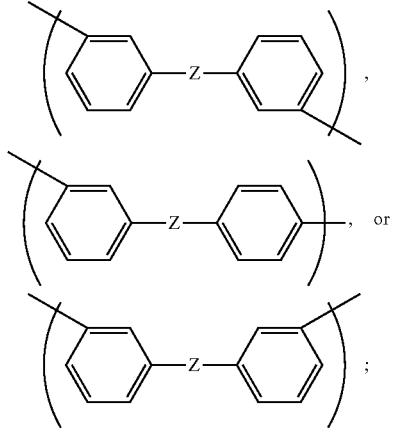

each $A_3$ is independently

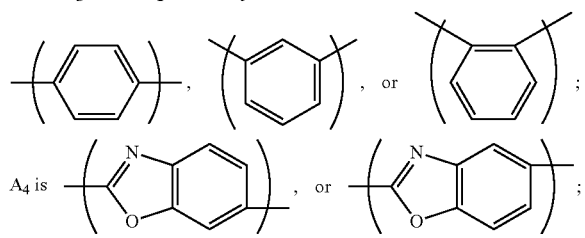

$A_4$ is

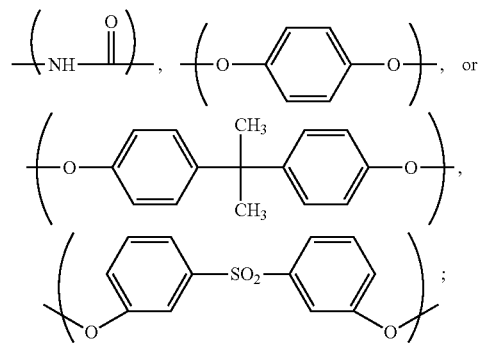

Z is —O—, —S—, —C(CH3)2-, —C(CF3)2-,

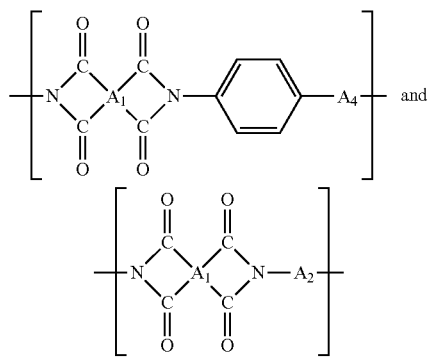

m is a positive integer that is greater than 1; n is a positive integer that is greater than 1; i is a positive integer between 1 and 3; and, j is a positive integer between 1 and 20; and, the repeat units are arranged in a random fashion.

16 Claims, No Drawings

(52) U.S. Cl.
CPC ....... *C08G73/1039* (2013.01); *C08G 73/1042* (2013.01); *C08G 73/1067* (2013.01); *C08G 73/1078* (2013.01); *C08G 73/1085* (2013.01); *G03F 7/0387* (2013.01)

(56) References Cited

U.S. PATENT DOCUMENTS

| | | | |
|---|---|---|---|
| 5,436,310 | A | 7/1995 | Dahl et al. |
| 5,514,505 | A | 5/1996 | Limburg et al. |
| 5,563,014 | A | 10/1996 | Malhotra et al. |
| 5,599,629 | A | 2/1997 | Gardner et al. |
| 5,599,856 | A | 2/1997 | Gardner |
| 5,741,585 | A * | 4/1998 | Harris ............... C08G 73/1085 428/357 |
| 5,869,229 | A | 2/1999 | Okada et al. |
| 5,919,892 | A * | 7/1999 | Hwang ............. C08G 73/1085 528/220 |
| 5,922,529 | A | 7/1999 | Tsuzuki et al. |
| 6,011,111 | A | 1/2000 | Brennan et al. |
| 6,524,764 | B1 | 2/2003 | Tomikawa et al. |
| 6,548,621 | B1 | 4/2003 | Tsai et al. |
| 6,593,043 | B2 | 7/2003 | Suwa et al. |
| 6,627,701 | B2 | 9/2003 | Adedeji et al. |
| 6,815,491 | B2 | 11/2004 | Adedeji et al. |
| 6,872,777 | B2 | 3/2005 | Adedeji et al. |
| 6,908,964 | B2 | 6/2005 | Adedeji et al. |
| 7,022,765 | B2 | 4/2006 | Adedeji et al. |
| 8,530,133 | B2 | 9/2013 | Bell et al. |
| 2002/0156185 | A1 | 10/2002 | Adedeji et al. |
| 2002/0165317 | A1 | 11/2002 | Adedeji et al. |
| 2003/0036602 | A1 | 2/2003 | Adedeji et al. |
| 2004/0082719 | A1 | 4/2004 | Adedeji et al. |
| 2004/0126693 | A1 | 7/2004 | Wang et al. |
| 2005/0109533 | A1 | 5/2005 | Kurashina et al. |
| 2005/0154130 | A1 | 7/2005 | Adedeji et al. |
| 2005/0282958 | A1 * | 12/2005 | Jeng ..................... C08K 5/42 524/606 |
| 2006/0004180 | A1 | 1/2006 | Itatani |
| 2011/0046268 | A1 | 2/2011 | Wang |
| 2012/0305484 | A1 | 12/2012 | Freeman et al. |
| 2013/0011651 | A1 * | 1/2013 | Iizumi ................... B29C 41/24 428/220 |
| 2013/0136934 | A1 * | 5/2013 | Iwai ....................... B29C 41/24 428/458 |
| 2013/0279126 | A1 * | 10/2013 | Chen ..................... B32B 15/08 361/749 |
| 2013/0313710 | A1 | 11/2013 | Sun et al. |
| 2013/0323640 | A1 | 12/2013 | Bell et al. |
| 2015/0000527 | A1 | 1/2015 | Lee et al. |
| 2015/0000528 | A1 | 1/2015 | Lee et al. |

FOREIGN PATENT DOCUMENTS

| | | |
|---|---|---|
| EP | 1262509 A | 12/2002 |
| TW | 555787 B | 10/2003 |
| TW | I230842 B | 4/2005 |
| TW | 200538875 A | 12/2005 |
| TW | 201343719 A | 11/2013 |
| WO | WO 2013/018524 A1 | 2/2013 |

OTHER PUBLICATIONS

Hsu et al., "A novel positive photosensitive polybenzoxazole precursor for microelectronic applications," Polymer, vol. 43, Issue 25, 2002 (Available Online Oct. 25, 2002), pp. 6743-6750.

Hsu et al., "Novel Positive-Working and Aqueous-Base-Developable Photosensitive Poly(imide benzoxazole) Precursor," Journal of Polymer Science: Part A: Polymer Chemistry, vol. 42, Issue 23, Dec. 1, 2004 (first published online Oct. 19, 2004), pp. 5990-5998.

Ogura et al., "Photosensitive Polybenzoxazole Based on a Poly(o-hydroxy amide), a Dissolution Inhibitor, and a Photoacid Generator," Journal of Polymer Science: Part A: Polymer Chemistry, vol. 45, Issue 4, Feb. 15, 2007 (first published online Jan. 8, 2007), pp. 661-668.

Tomikawa et al., "Effect of Photo-active Compound Structure on Photosensitivity of Positive Photosensitive Polyimide," High Performance Polymers, vol. 18, No. 5, Oct. 2006, pp. 603-615.

Taiwan Office Action mailed Apr. 6, 2016 for TW Application No. 104116756.

* cited by examiner

POLYMER, METHOD FOR PREPARING THE SAME, AND A PHOTOSENSITIVE RESIN COMPOSITION THEREOF

TECHNICAL FIELD

The disclosure relates to a polymer, a method for preparing the same, and a photosensitive resin composition thereof.

BACKGROUND

Due to its excellent thermal stability and good mechanical, electrical, and chemical properties, polyimide (PI) is widely used in semiconductor and display industries as, for example, the encapsulation film of an IC chip and an insulator in chip scale package (CSP) and display. As demand for higher computing speed, small device size, and low power consumption of electronic products increases, the direction taken by development efforts will focus on electronic products with a three-dimensional stack package structure and/or increased integration density. As a result, the application calls for material having low curing temperatures and stress. However, in order to obtain a polyimide material with excellent thermal stability and good mechanical, electrical and chemical properties, conventional photosensitive polyimide should be subjected to imidization at a high temperature, such as 350° C. Furthermore, a film made by the conventional photosensitive polyimide cured at high temperature is apt to result in cracks, delamination, or a deformation of the carrier. Such damage to the electronic products is due to the internal stress of the conventional photosensitive polyimide.

Therefore, a novel polymer material with a low curing temperature and stress for use in the semiconductor industry is desired for solving the aforementioned problems.

The disclosure provides a polymer, and the polymer has a structure represented by Formula (I)

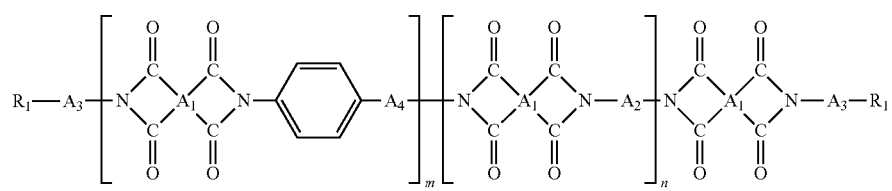

Formula (I)

wherein $R_1$ is —OH, or —COOH; $A_1$ is

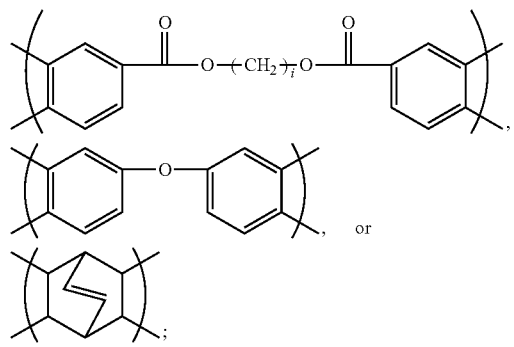

each $A_2$ is independently

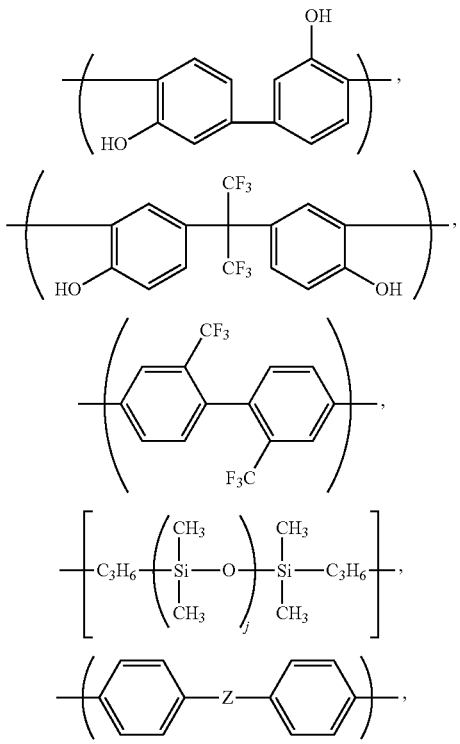

-continued

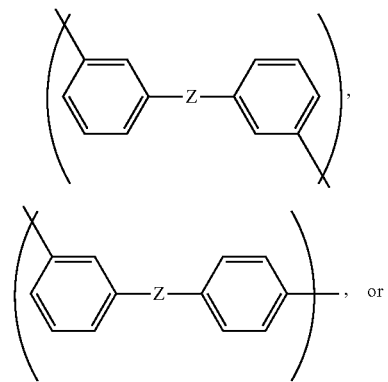

-continued

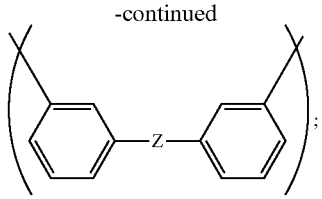

each $A_3$ is independently

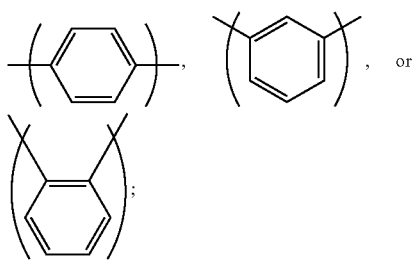

$A_4$ is

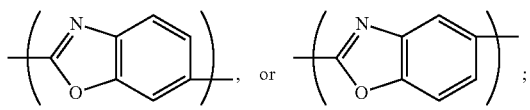

Z is —O—, —SO$_2$—, —C(CH$_3$)$_2$—, —C(CF$_3$)$_2$—,

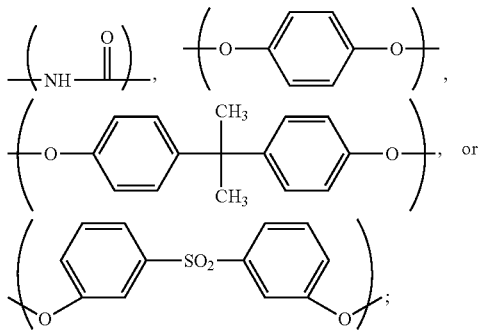

m is a positive integer that is greater than 1, such as any integer between 2 and 100; n is a positive integer that is greater than 1, such as any integer between 2 and 100; i is a positive integer between 1 and 5; and, j is a positive integer between 1 and 20, such as any integer between 1 and 10.

The polymer of the disclosure can include repeat units represented by

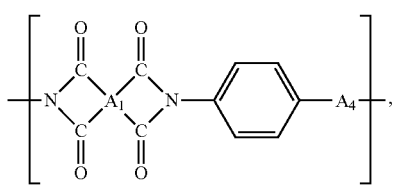

and repeat units represented by

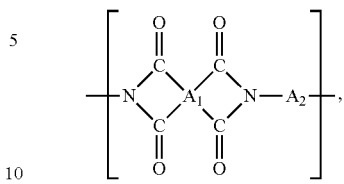

wherein the repeat units represented by

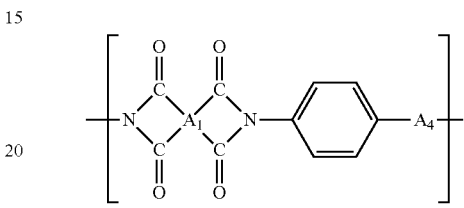

and the repeat units represented by

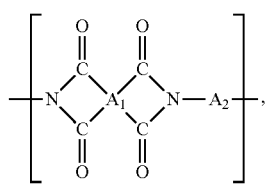

can be arranged in a regular or random fashion.

According to some embodiments of the disclosure, the disclosure provides a method for preparing the above polymer, includes the following steps. A composition is subjected to a polymerization, obtaining the above polymer of the disclosure. The composition includes at least one of an anhydride having a structure represented by Formula (II), at least one of a diamine having a structure represented by Formula (III), at least one of a diamine having a structure represented by Formula (IV), and at least one of a compound having a structure represented by Formula (V):

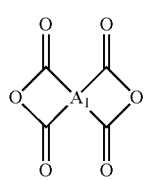

Formula (II)

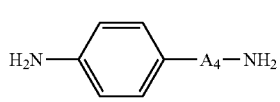

Formula (III)

H$_2$N-A$_2$-NH$_2$    Formula (IV)

H$_2$N-A$_3$-R$_1$    Formula (V), wherein $R_1$ is —OH, or —COOH; $A_1$ is

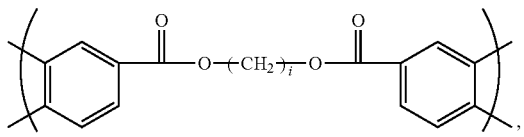

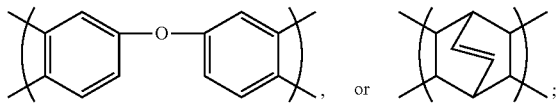, or 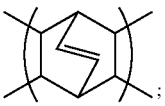;

$A_2$ is independently

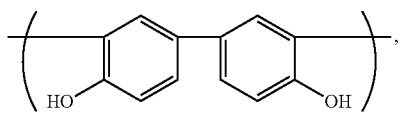

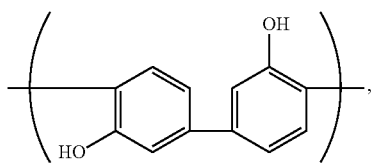

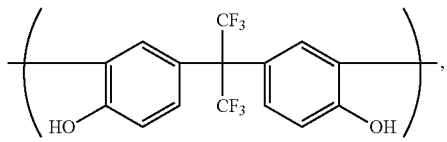

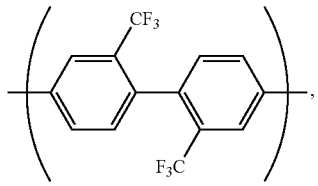

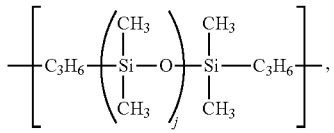

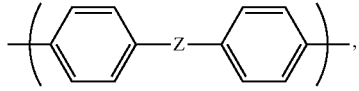

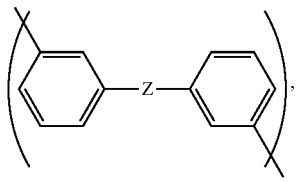

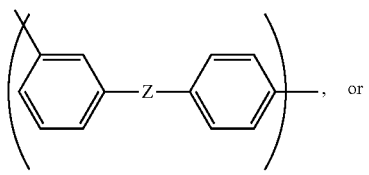, or

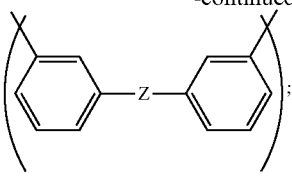;

each $A_3$ is independently

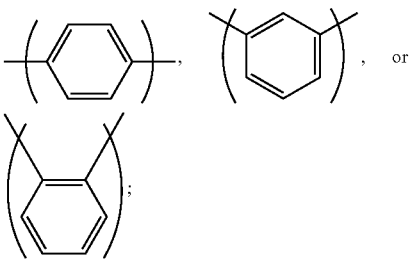;

$A_4$ is

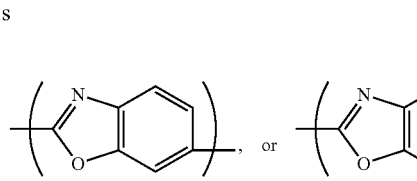;

$Z$ is —O—, —SO$_2$—, —C(CH$_3$)$_2$—, —C(CF$_3$)$_2$—,

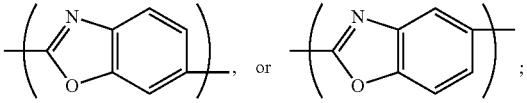

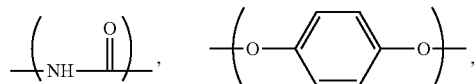

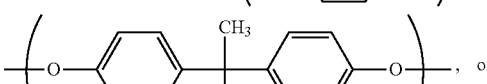, or

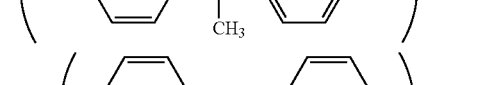

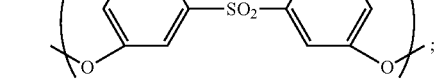;

$m$ is a positive integer that is greater than 1, such as any integer between 2 and 100; $n$ is a positive integer that is greater than 1, such as any integer between 2 and 100; $i$ is a positive integer between 1 and 5; and, $j$ is a positive integer between 1 and 20, such as any integer between 1 and 10.

According to an embodiment of the disclosure, the disclosure also provides a photosensitive resin composition. The photosensitive resin composition includes components (A)-(C) uniformly distributed in a solvent. In particular, the component (A) is the polymer having a structure represented by Formula (I); the component (B) is a compound having a phenyl group; and, the component (C) is a photosensitive agent.

DETAILED DESCRIPTION

According to an embodiment of the disclosure, the disclosure provides a polymer. Due to the phenylbenzoxazole moiety introduced in the main chain structure and terminal hydroxyl or carboxyl groups of the polymer, the polymer of the disclosure is suitable for dissolving in an organic solvent. Furthermore, the disclosure provides a photosensitive resin composition includes a phenol hardener, a photosensitive agent and the polymer of the disclosure. It should be noted that, after photolithography, the photosensitive resin composition of the disclosure can be cured at a temperature that is equal to or less than 230° C. to undergo a cross-linking reaction. The pattern including the cured product of the photosensitive resin composition exhibits high developability, resolution, electrical properties, and chemical resistance.

According to an embodiment of the disclosure, the polymer of the disclosure can have a structure represented by Formula (I):

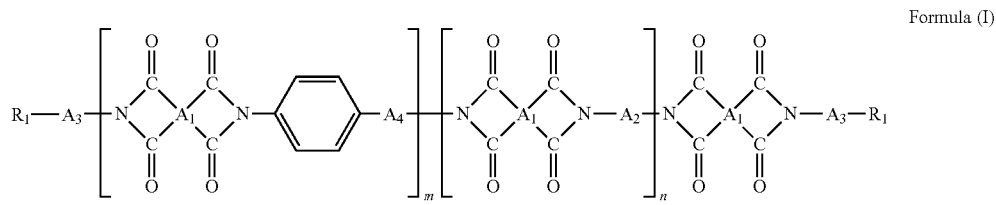

Formula (I)

wherein, $R_1$ can be —OH, or —COOH; $A_1$ can be

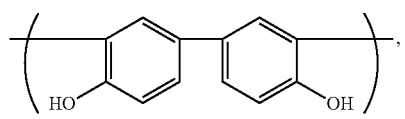

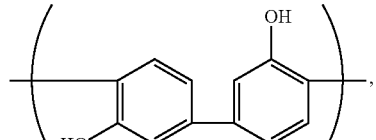, or

;

each $A_2$ can be independently

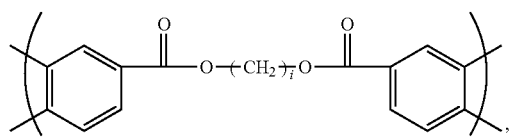

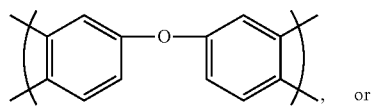

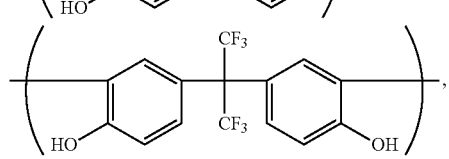

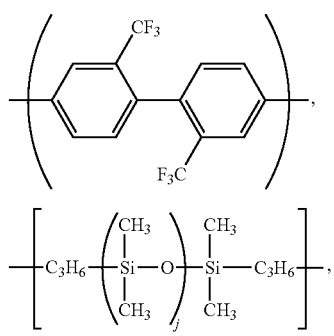

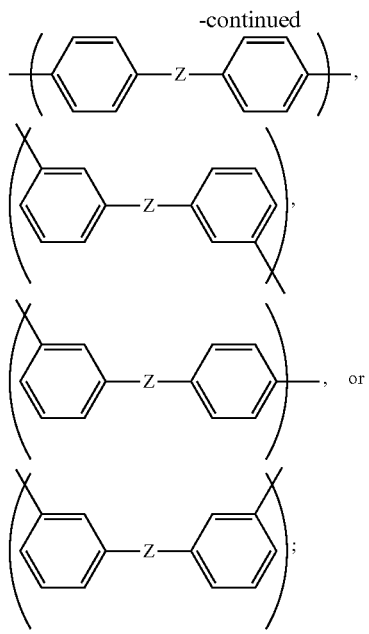

each $A_3$ can be independently

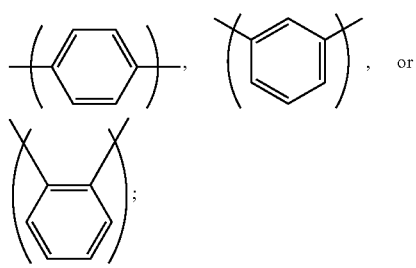

$A_4$ can be

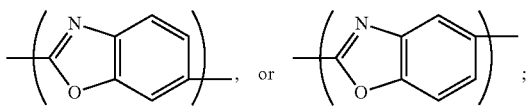

Z can be —O—, —SO$_2$—, —C(CH$_3$)$_2$—, —C(CF$_3$)$_2$—,

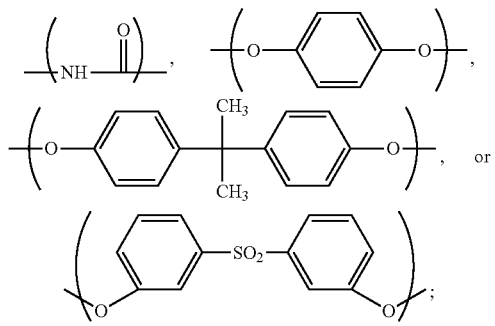

m can be a positive integer that is greater than 1, such as any integer between 2 and 100; n can be a positive integer that is greater than 1, such as any integer between 2 and 100; i can be a positive integer between 1 and 5; and, j can be a positive integer between 1 and 20, such as any integer between 1 and 10.

According to an embodiment of the disclosure, the polymer of the disclosure can have repeat units represented by

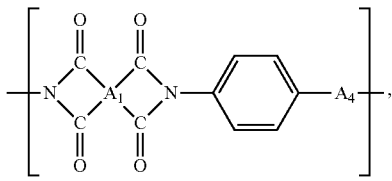

and repeat units represented by

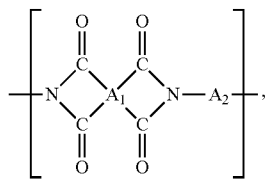

wherein the repeat units represented by

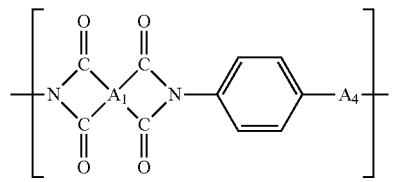

and the repeat units represented by

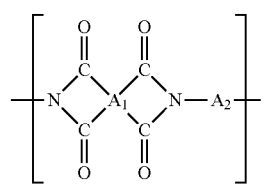

can be arranged in a regular or random fashion.

According to some embodiments of the disclosure, the polymer can have m repeat units represented by

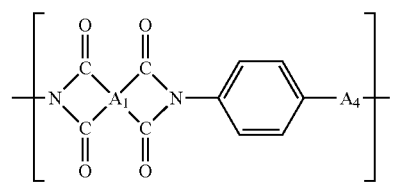

and n repeat units represented by

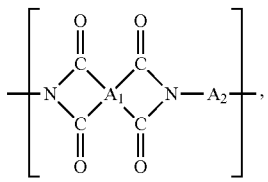

wherein m/(m+n) is from about 0.05 to 0.9, such as from 0.1 to 0.4. When m/(m+n) is less than 0.05 or larger than 0.9, the cured product of the photosensitive resin composition including the polymer has a poor developability and low chemical resistance. In one embodiment, when m/(m+n) is between 0.1 and 0.4, the photosensitive resin composition including the polymer can be cured at a temperature that is equal to or less than 230° C. (such as between 180° C. and 230° C.) to undergo a cross-linking reaction, and the cured product of the photosensitive resin composition has an improved developability (i.e. the coating of the photosensitive resin composition, which is not irradiated with a light (such as ultraviolet light), can be completely removed after development) and superior chemical resistance. According to embodiments of the disclosure, the polymer can have an inherent viscosity (IV) between 0.15 dL/g and 0.35 dL/g.

According to some embodiments of the disclosure, the disclosure provides a method for preparing the polymer having a structure represented by Formula (I). The method includes subjecting a composition to a polymerization. The composition is prepared by the following steps. First, at least one of the diamines having a structure represented by Formula (III), at least one of the diamines having a structure represented by Formula (IV), and at least one of the anhydrides having a structure represented by Formula (II) are mixed with a solvent to obtain a mixture. Next, at least one of the compounds having a structure represented by Formula (V) was added into the mixture, Formula (II)
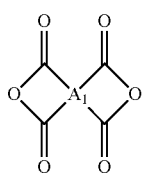

Formula (III)
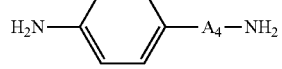

H₂N-A₂-NH₂  Formula (IV)

H₂N-A₃-R₁  Formula (V), wherein $R_1$ can be —OH, or —COOH; $A_1$ can be

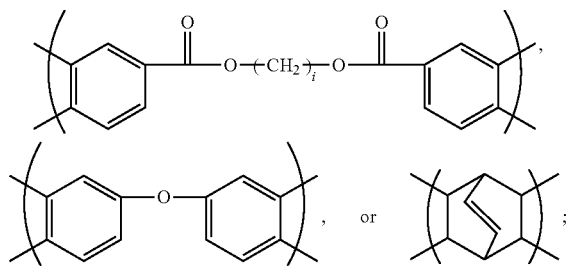

each $A_2$ can be independently

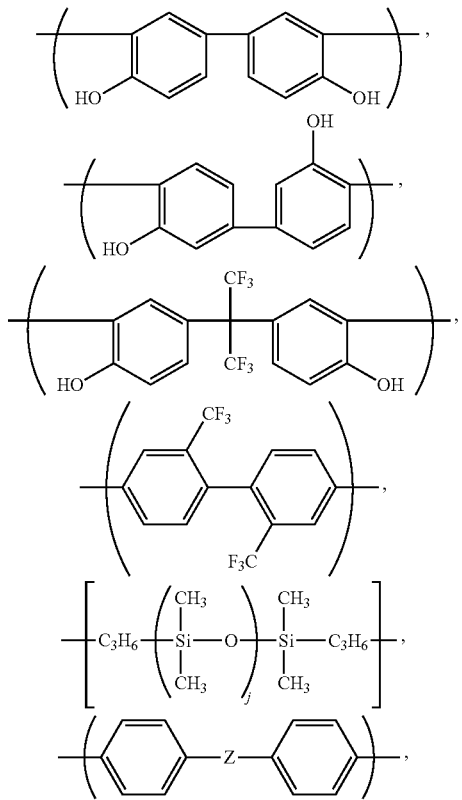

$A_3$ can be independently $A_4$ can be $Z$ can be —O—, —SO₂—, —C(CH₃)₂—, —C(CF₃)₂—, $m$ can be a positive integer that is greater than 1, such as any integer between 2 and 100; $n$ can be a positive integer that is greater than 1, such as any integer between 2 and 100; $i$ can be a positive integer between 1 and 5; and, $j$ can be a positive integer between 1 and 20, such as any integer between 1 and 10. According to an embodiment of the disclosure, the composition can be further subjected to a thermal treatment to undergo a cross-linking wherein the thermal treatment can have a process temperature between 100 and 220° C. According to an embodiment of the disclosure, the solvent can be N-methyl-2-pyrrolidone (NMP), γ-butyrolactone (GBL), xylene, or a combination thereof.

According to an embodiment of the disclosure, the method for preparing the polymer can include the following steps. First, the anhydride having a structure represented by Formula (II) and the diamines having structures represented by Formula (III) and Formula (IV) are dissolved in a solvent (such as: N-methyl-2-pyrrolidone (NMP)) to obtain a mixture. Next, the mixture is stirred at a low temperature (such as 0° C.-10° C.) for several hours (such as about 1-10 hours). Next, the compound having a structure represented by Formula (V) (severing as an end-capped agent) is added into the mixture. After stirring for several hours (such as about 1-10 hours), a solvent (such as: xylene) was added into the mixture, and then the result was heated at a temperature between 100° C. and 220° C. (depending on the solvent) to reflux. After the reaction was complete, a solution including a polymer with terminal hydroxyl or carboxyl group located in the main chain was obtained. Next, a solvent can be optionally added into the solution to modify the concentration of the solution for subsequent use.

According to an embodiment of the disclosure, the composition can include 1 part by mole of the anhydride having a structure represented by Formula (II), 0.2-0.5 parts by mole of the diamine having a structure represented by Formula (III), 0.4-0.9 parts by mole of the diamine having a structure represented by Formula (IV), and 0.1-0.4 parts by mole of the compound having a structure represented by Formula (V). In addition, the ratio between the sum of the moles of the diamines having structures represented by Formula (III) and Formula (IV) and one-half of the moles of the compound having a structure represented by Formula (V) to the moles of the anhydride having a structure represented by Formula (II) is from 0.7 to 1.6. Namely, the moles of the diamine having a represented by Formula (III) is $M_1$, the moles of the diamine having a structure represented by Formula (IV) is $M_2$, the moles of the compound having a structure represented by Formula (V) is $M_3$, the moles of the anhydride having a structure represented by Formula (II) is M4, and the relationship between $M_1$, $M_2$, $M_3$, and $M_4$ can be described by the following equation: $0.7 \le [(M_1+M_2+M_3/2)/M_4] \le 1.6$. According to other embodiments of the disclosure, the ratio between the sum of the moles of the diamines having structures represented by Formula (III) and Formula (IV) and one-half of the moles of the compound having a structure represented by Formula (V) to the moles of the anhydride having a structure represented by Formula (II) is from 0.8 to 1.2. Namely, the relationship between $M_1$, $M_2$, $M_3$, and M4 can be described by the following equation:

$$0.85 \le (M_1+M_2+M_3/2)/M_4] \le 1.2.$$

On the other hand, the ratio between the moles of the diamine having a structure represented by Formula (III) to the sum of the moles of the diamines having structures represented by Formula (III) and Formula (IV) can be from 0.05 to 0.9. Namely, the moles of the diamine having a structure represented by Formula (III) is $M_1$, the moles of the diamine having a structure represented by Formula (IV) is $M_2$, and the relationship between M1 and $M_2$ can be described by the following equation: $0.05 \le [M_1/(M_1+M_2)] \le 0.9$. According to other embodiments of the disclosure, in order to improve the developability and the chemical resistance of the cured product of the photosensitive resin composition including the polymer, the ratio between the moles of the diamine having a structure represented by Formula (III) to the sum of the moles of the diamines having structures represented by Formula (III) and Formula (IV) can be between 0.1 and 0.4. Namely, the moles of the diamine having a structure represented by Formula (III) is $M_1$, the moles of the diamine having a structure represented by Formula (IV) is $M_2$, and the relationship between $M_1$ and $M_2$ can be described by the following equation:

$$0.1 \le [M_1/(M_1+M_2)] \le 0.4.$$

Moreover, according to an embodiment of the disclosure, in order to increase the cross-linking degree between the polymer and the cross-linking agent (such as a compound having a phenyl group) during post curing without reducing the developability of the composition, the mole ratio between the compound having a structure represented by Formula (V) to the anhydride having a structure represented by Formula (II) is from 0.1 to 0.3. Namely, the moles of the compound having a structure represented by Formula (V) is $M_3$, the moles of the anhydride having a structure represented by Formula (II) is M4, and the relationship between $M_3$ and $M_4$ can be described by the following equation: $0.1 \le (M_3/M_4)] \le 0.3$. When the mole ratio is less than 0.1, the photosensitive resin composition including the polymer would have a poor developability. When the mole ratio is higher than 0.3, the cured product of the photosensitive resin composition including the polymer will have poor chemical resistance. For example, the cured product of the photosensitive resin composition may be damaged by a developer.

According to other embodiments of the disclosure, the disclosure provides a photosensitive resin composition, which can be developed by an alkaline aqueous solution in a short time, and has a high sensitivity, good resolution, low post-cure temperature, high film thickness retention rate, and high chemical resistance. In addition, the photosensitive resin composition of the disclosure can be stored stably at room temperature.

The photosensitive resin composition of the disclosure including components (A)-(C) uniformly distributed in a solvent: (A) a polymer as claimed in claim 1; (B) a compound having a phenyl group; and (C) a photosensitive agent. According to an embodiment of the disclosure, the photosensitive resin composition can include 100 parts by weight of (A) the polymer, 1-50 parts by weight (such as 5-25 parts by weight) of (B) compound, and 1-50 parts by weight (such as 5-25 parts by weight) of (C) the photosensitive agent.

According to an embodiment of the disclosure, (B) the compound having a phenyl group can be

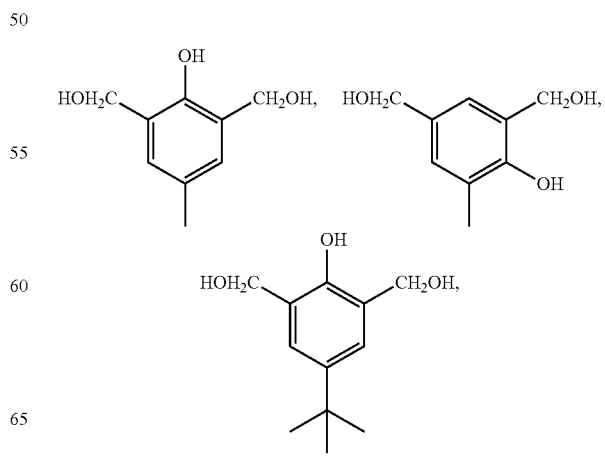

-continued

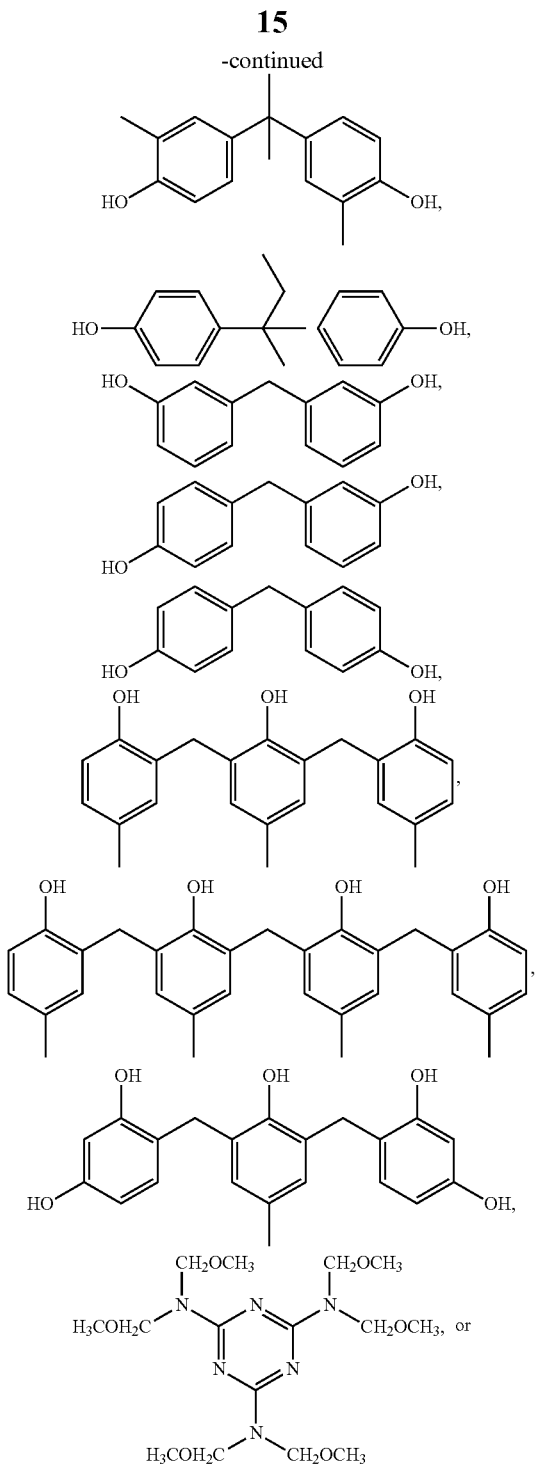

a combination thereof.

According to an embodiment of the disclosure, (C) the photosensitive agent can include a quinonediazide sulfonate. For example, (C) the photosensitive agent can be

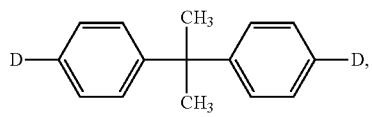

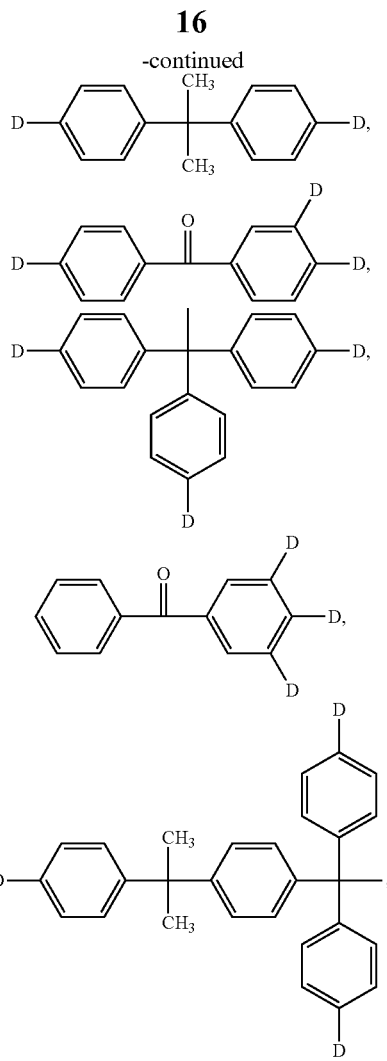

or a combination thereof, wherein D is independently —OH,

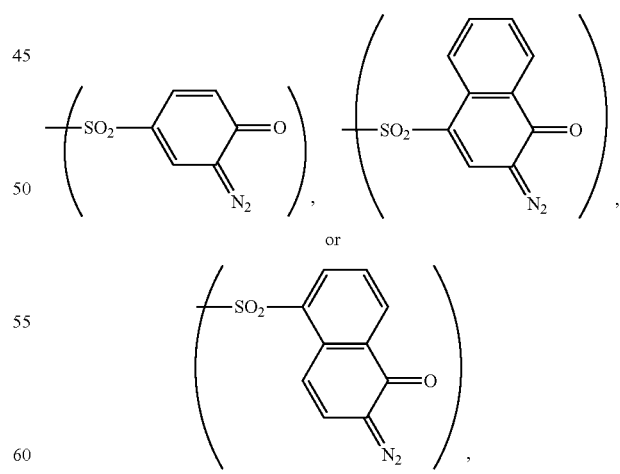

and at least one of D of the photosensitive agent cannot be —OH.

According to an embodiment of the disclosure, the solvent can be N-methyl-2-pyrrolidone (NMP), γ-butyrolactone (GBL), or a combination thereof.

The photolithographic process employing the photosensitive resin composition of the disclosure can include: (i) coating the photosensitive resin on a suitable substrate by using a spin coating or other coating process; (ii) pre-baking the coating; (iii) exposing the pre-baked coating; (iv) developing the exposed coating; and (v) post-curing the developed coating, thereby obtaining a cured layer. In step (i), the photosensitive resin composition is coated on a suitable substrate, e.g. silicon substrate, glass, or ITO glass. A suitable coating technique includes, but not limited to, spin coating, roller coating, screen coating, curtain coating, dip coating, and spray coating. In a preferred embodiment of the present invention, a layer resulting from the coating is pre-baked at 60° C.-120° C. for a few minutes to evaporate the solvent contained therein. Next, the coated substrate is imagewise exposed to an irradiation with a photo-mask. The abovementioned irradiation includes, for example, an X-ray, electron beam, UV ray, visible ray, or any photo source suitable for being used as an irradiation source. After exposure, said coated substrate is subsequently developed with an alkaline aqueous developer solution to remove the unexposed portion of said coating layer, so that the pattern of the photo-mask is transferred. Said alkaline aqueous developer solution may be an alkaline aqueous solution, e.g. an aqueous solution of an inorganic alkaline (potassium hydroxide, or sodium hydroxide), a primary amine (ethylamine), a secondary amine (diethylamine), a tertiary amine (triethylamine), or a quaternary ammonium salt (tetramethylammonium hydroxide), and preferably an aqueous solution of tetramethylammonium hydroxide (TMAH). Developing can be accomplished by immersion, spraying, or other known developing methods. The patterned layer is subsequently washed with deionized water. Since the photosensitive resin composition includes a polymer having a structure represented by Formula (I), the resulting patterned layer can be post-cured at a temperature that is equal to or less than 230° C. (such as between 180° C.-230° C.), thereby obtaining a patterned cured layer with a high developability, resolution, electrical properties, and chemical resistance.

In order to clearly disclose the polymer and the photosensitive resin composition of the disclosure, the following examples and comparative examples are intended to illustrate the disclosure more fully without limiting their scope, since numerous modifications and variations will be apparent to those skilled in this art.

Preparation of Polymer Having a Structure Represented by Formula (I)

Example 1

2,2-bis(3-amino-4-hydroxyphenyl) hexafluoropropane (BisAPAF, having a structure represented by

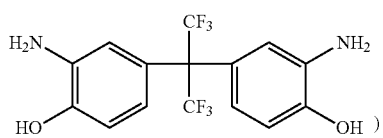 [SMILES: Nc1cc(C(c2ccc(O)c(N)c2)(C(F)(F)F)C(F)(F)F)ccc1O]

(57.5 mmol), 5-Amino-2-(4-aminophenyl)benzoxazole (5-ABO, having a structure represented by

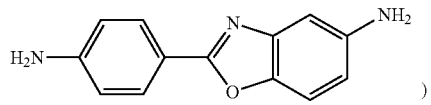 [SMILES: Nc1ccc(-c2nc3cc(N)ccc3o2)cc1]

(20 mmol), 1,3-bis(3-aminopropyl-1,1,3,3-tetramethyldisiloxane (siloxane 248, having a structure represented by

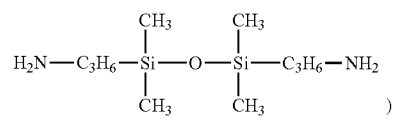

(10 mmol), ethylene glycol bisanhydrotrimellitate (TMEG, having a structure represented by

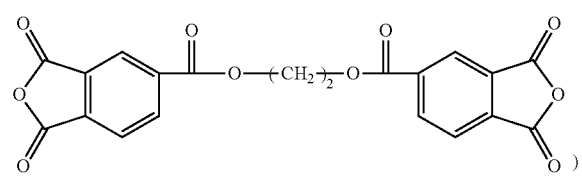

(100 mmol), and N-methyl-2-pyrrolidone (NMP) (200 g) were added into a reaction bottle under nitrogen. Next, after cooling to 0° C. and then stirring for 4 hours, 3-aminophenol (having a structure represented by

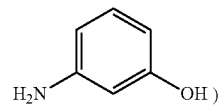

(25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (I) was obtained. Table 1 shows the components and the repeat unit ratio of the obtained polymer of Example 1. Finally, the inherent viscosity of the polymer of the polymer solution (I) was measured, and the inherent viscosity of the polymer is 0.21 dL/g.

Example 2

2,2-bis(3-amino-4-hydroxyphenyl) hexafluoropropane (BisAPAF) (57.5 mmol), 6-Amino-2-(4-aminophenyl)benzoxazole (6-ABO, having a structure represented by

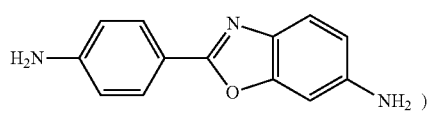

(20 mmol), 1,3-bis(3-aminopropyl-1,1,3,3-tetramethyldisiloxane (siloxane 248) (10 mmol), and ethylene glycol bisanhydrotrimellitate (TMEG) (100 mmol), and 200 g of N-methyl-2-pyrrolidone (NMP) were added into a reaction bottle under nitrogen. Next, after cooling to 0° C. and then stirring for 4 hours, 3-aminophenol (25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (II) was obtained. Table 1 shows the components and the repeat unit ratio of the obtained polymer of Example 2. Finally, the inherent viscosity of the polymer of the polymer solution (II) was measured, and the inherent viscosity of the polymer is 0.22 dL/g.

Example 3

2,2-bis(3-amino-4-hydroxyphenyl) hexafluoropropane (BisAPAF) (57.5 mmol), 55-Amino-2-(4-aminophenyl)benzoxazole(5-ABO) (20 mmol), 1,3-bis(3-aminopropyl-1,1,3,3-tetramethyldisiloxane (siloxane 248) (10 mmol), and 4,4'-dianhydride (ODPA, having a structure represented by

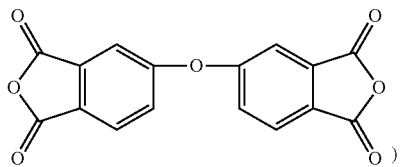 [SMILES: O=C1OC(=O)c2cc(Oc3ccc4c(c3)C(=O)OC4=O)ccc21]

(100 mmol), and 200 g of N-methyl-2-pyrrolidone (NMP) were added into a reaction bottle under nitrogen. Next, after cooling to 0° C. and then stirring for 4 hours, 3-aminophenol (25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (III) was obtained. Table 1 shows the components and the repeat unit ratio of the obtained polymer of Example 3. Finally, the inherent viscosity of the polymer of the polymer solution (III) was measured, and the inherent viscosity of the polymer is 0.25 dL/g.

Example 4

2,2-bis(3-amino-4-hydroxyphenyl) hexafluoropropane (BisAPAF) (57.5 mmol), 6-Amino-2-(4-aminophenyl)benzoxazole (6-ABO) (20 mmol), 1,3-bis(3-aminopropyl-1,1,3,3-tetramethyldisiloxane (siloxane 248) (10 mmol), and 4,4'-Oxydiphthalic dianhydride (ODPA) (100 mmol), and 200 g of N-methyl-2-pyrrolidone (NMP) were added into a reaction bottle under nitrogen. Next, after cooling to 0° C. and then stirring for 4 hours, 3-aminophenol (25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (IV) was obtained. Table 1 shows the components and the repeat unit ratio of the obtained polymer of Example 4. Finally, the inherent viscosity of the polymer of the polymer solution (IV) was measured, and the inherent viscosity of the polymer is 0.24 dL/g.

Example 5

2,2-bis(3-amino-4-hydroxyphenyl) hexafluoropropane (BisAPAF) (52.5 mmol), 6-Amino-2-(4-aminophenyl)benzoxazole (6-ABO) (35 mmol), and 4,4'-Oxydiphthalic dianhydride (ODPA) (100 mmol), and 200 g of N-methyl-2-pyrrolidone (NMP) were added into a reaction bottle under nitrogen. Next, after cooling to 0° C. and then stirring for 4 hours, 3-aminophenol (25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (V) was obtained. Table 1 shows the components and the repeat unit ratio of the obtained polymer of Example 5. Finally, the inherent viscosity of the polymer of the polymer solution (V) was measured, and the inherent viscosity of the polymer is 0.3 dL/g.

Example 6

2,2-bis(3-amino-4-hydroxyphenyl) hexafluoropropane (BisAPAF) (57.5 mmol), 55-Amino-2-(4-aminophenyl)benzoxazole(5-ABO) (20 mmol), 1,3-bis(3-aminopropyl-1,1,3,3-tetramethyldisiloxane (siloxane 248) (10 mmol), and bicyclo[2.2.2]oct-7-ene-2,3,5,6-tetracarboxylic dianhydride (B1317, having a structure represented by

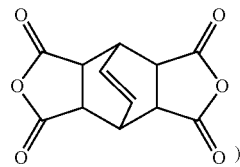 [SMILES: O=C1OC(=O)C2C3C=CC(C12)C1C(=O)OC(=O)C31]

(100 mmol), and 200 g of N-methyl-2-pyrrolidone (NMP) were added into a reaction bottle under nitrogen. Next, after cooling to 0° C. and then stirring for 4 hours, 3-aminophenol (25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (VI) was obtained. Table 1 shows the components and the repeat unit ratio of the obtained polymer of Example 6. Finally, the inherent viscosity of the polymer of the polymer solution (VI) was measured, and the inherent viscosity of the polymer is 0.21 dL/g.

Example 7

2,2-bis(3-amino-4-hydroxyphenyl) hexafluoropropane (BisAPAF) (57.5 mmol), 6-Amino-2-(4-aminophenyl)benzoxazole (6-ABO) (20 mmol), 1,3-bis(3-aminopropyl-1,1,3,3-tetramethyldisiloxane (siloxane 248) (10 mmol), and bicyclo[2.2.2]oct-7-ene-2,3,5,6-tetracarboxylic dianhydride (B1317) (100 mmol), and 200 g of N-methyl-2-pyrrolidone (NMP) were added into a reaction bottle under nitrogen. Next, after cooling to 0° C. and then stirring for 4 hours, 3-aminophenol (25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (VII) was obtained. Table 1 shows the components and the repeat unit ratio of the obtained polymer of Example 7. Finally, the inherent viscosity of the polymer of the polymer solution (VII) was measured, and the inherent viscosity of the polymer is 0.2 dL/g.

Comparative Example 1

2,2-bis(3-amino-4-hydroxyphenyl) hexafluoropropane (BisAPAF) (77.5 mmol), 1,3-bis(3-aminopropyl-1,1,3,3-tetramethyldisiloxane (siloxane 248) (10 mmol), and ethylene glycol bisanhydrotrimellitate (TMEG) (100 mmol), and 200 g of N-methyl-2-pyrrolidone (NMP) were added into a reaction bottle under nitrogen. Next, after cooling to 0° C. and then stirring for 4 hours, 3-aminophenol (25 mmol) serving as an end-capped agent was added into the reaction bottle, and then the mixture was stirred for 4 hours at room temperature. Next, 80 g of xylene was added into the reaction bottle, and the was heated to 180° C. and stirred for 3 hours. After cooling, a polymer solution (VIII) was obtained. Table 1 shows the components and the repeat unit ratio of the obtained polymer of Comparative Example 1. Finally, the inherent viscosity of the polymer of the polymer solution (VIII) was measured, and the inherent viscosity of the polymer is 0.28 dL/g.

Comparative Example 2

2,2-bis(3-amino-4-hydroxyphenyl) hexafluoropropane (BisAPAF) (43.75 mmol), 55-Amino-2-(4-aminophenyl)benzoxazole(5-ABO) (43.75 mmol), and ethylene glycol bisanhydrotrimellitate (TMEG) (100 mmol), and 200 g of N-methyl-2-pyrrolidone (NMP) were added into a reaction bottle under nitrogen. Next, after cooling to 0° C. and then stirring for 4 hours, 3-aminophenol (25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (IX) was obtained. Table 1 shows the components and the repeat unit ratio of the obtained polymer of Comparative Example 2. Finally, the inherent viscosity of the polymer of the polymer solution (IX) was measured, and the inherent viscosity of the polymer is 0.39 dL/g.

Note: the moles of the diamine having a structure represented by Formula (IV) is substituted for m, and the moles of the diamines having a structure represented by Formula (III) is substituted for n, and m/(m+n) is measured.

Example 8

3,3'-dihydroxybenzidine (P-HAB, having a structure represented by

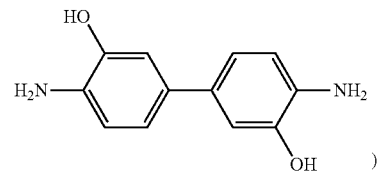 [SMILES: Nc1ccc(-c2ccc(N)c(O)c2)cc1O]

)

(55 mmol), 5-Amino-2-(4-aminophenyl)benzoxazole (5-ABO, having a structure represented by

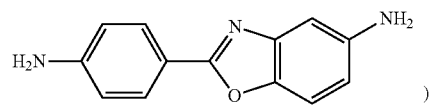 [SMILES: Nc1ccc(-c2nc3cc(N)ccc3o2)cc1]

)

(20 mmol), 2,2'-bis(trifluoromethyl)benzidine (TFMB, having a structure represented by

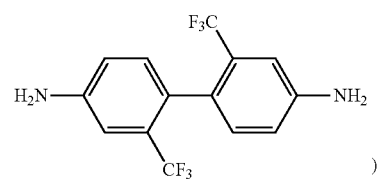 [SMILES: Nc1ccc(-c2ccc(N)cc2C(F)(F)F)c(C(F)(F)F)c1]

)

(10 mmol), and ethylene glycol bisanhydrotrimellitate (TMEG, having a structure represented by

TABLE 1

|  | anhydride having a structure represented by Formula (II)/ mmol | diamine having a structure represented by Formula (III)/mmol | diamine having a structure represented by Formula (IV)/ mmol | 3-aminophenol (mmol) | m/(m + n) (corresponding to Formula (I)) |
|---|---|---|---|---|---|
| Example 1 | TMEG/100 | BisAPAF/57.5 siloxane 248/10 | 5-ABO/20 | 25 | 0.228 |
| Example 2 | TMEG/100 | BisAPAF/57.5 siloxane 248/10 | 6-ABO/20 | 25 | 0.228 |
| Example 3 | ODPA/100 | BisAPAF/57.5 siloxane 248/10 | 5-ABO/20 | 25 | 0.228 |
| Example 4 | ODPA/100 | BisAPAF/57.5 siloxane 248/10 | 6-ABO/20 | 25 | 0.228 |
| Example 5 | ODPA/100 | BisAPAF/52.5 | 6-ABO/35 | 25 | 0.4 |
| Example 6 | B1317/100 | BisAPAF/57.5 siloxane 248/10 | 5-ABO/20 | 25 | 0.228 |
| Example 7 | B1317/100 | BisAPAF/57.5 siloxane 248/10 | 6-ABO/20 | 25 | 0.228 |
| Comparative Example 1 | TMEG/100 | BisAPAF/77.5 siloxane 248/10 | — | 25 | 0 |
| Comparative Example 2 | TMEG/100 | BisAPAF/43.75 | 5-ABO/43.75 | 25 | 0.5 |

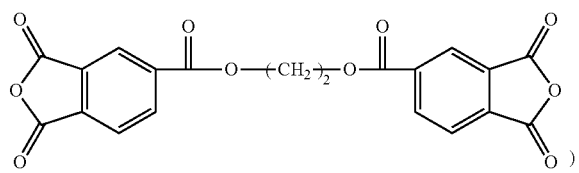

(100 mmol), and 200 g of N-methyl-2-pyrrolidone (NMP) were added into a reaction bottle under nitrogen. Next, after cooling to 0° C. and then stirring for 4 hours, 3-aminophenol (having a structure represented by

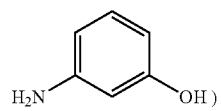

(30 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (X) was obtained. Table 2 shows the components and the repeat unit ratio of the obtained polymer of Example 8. Finally, the inherent viscosity of the polymer of the polymer solution (X) was measured, and the inherent viscosity of the polymer is 0.19 dL/g.

Example 9

2,2-bis(3-amino-4-hydroxyphenyl) hexafluoropropane (BisAPAF, having a structure represented by

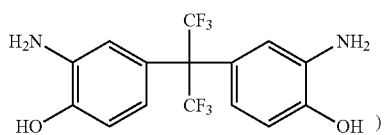 [SMILES: Nc1cc(C(c2ccc(O)c(N)c2)(C(F)(F)F)C(F)(F)F)ccc1O]

(55 mmol), 5-Amino-2-(4-aminophenyl)benzoxazole (5-ABO, having a structure represented by

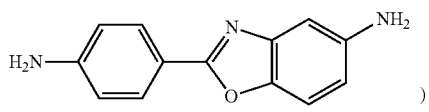

(20 mmol), 2,2-Bis[4-(4-aminophenoxy)phenyl] propane (BAPP, having a structure represented by

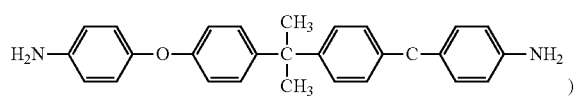

(10 mmol), and ethylene glycol bisanhydrotrimellitate (TMEG, having a structure represented by

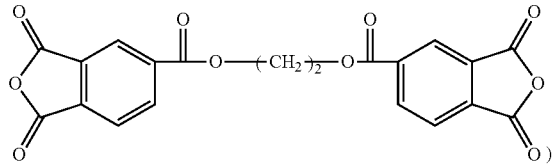

(100 mmol), and 200 g of N-methyl-2-pyrrolidone (NMP) were added into a reaction bottle under nitrogen. Next, after cooling to 0° C. and then stirring for 4 hours, 3-aminophenol (having a structure represented by

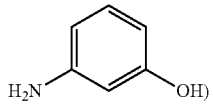

(30 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (XI) was obtained. Table 2 shows the components and the repeat unit ratio of the obtained polymer of Example 9. Finally, the inherent viscosity of the polymer of the polymer solution (XI) was measured, and the inherent viscosity of the polymer is 0.22 dL/g.

Example 10

2,2-bis(3-amino-4-hydroxyphenyl) hexafluoropropane (BisAPAF) (52.5 mmol), 55-Amino-2-(4-aminophenyl)benzoxazole(5-ABO) (25 mmol), bis[4-(3-aminophenoxy)phenyl] sulfone (m-BAPS, having a structure represented by

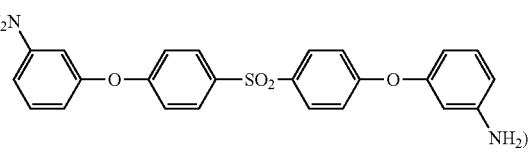

(10 mmol), and 4,4'-Oxydiphthalic dianhydride (ODPA, having a structure represented by

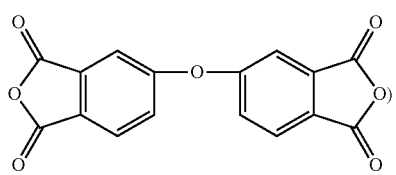

(100 mmol), and 200 g of N-methyl-2-pyrrolidone (NMP) were added into a reaction bottle under nitrogen. Next, after cooling to 0° C. and then stirring for 4 hours, 3-aminophenol (25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (XII) was obtained. Table 2 shows the components and the repeat unit ratio of the obtained polymer of Example 10. Finally, the inherent viscosity of the polymer of the polymer solution (XII) was measured, and the inherent viscosity of the polymer is 0.21 dL/g.

Example 11

2,2-bis(3-amino-4-hydroxyphenyl) hexafluoropropane (BisAPAF) (55 mmol), 55-Amino-2-(4-aminophenyl)benzoxazole(5-ABO) (20 mmol), 4,4'-Oxydianiline (ODA, having a structure represented by

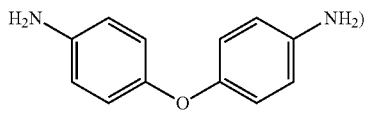

(10 mmol), and bicyclo[2.2.2]oct-7-ene-2,3,5,6-tetracarboxylic dianhydride (B1317, having a structure represented by

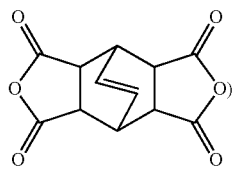

(100 mmol), and 200 g of N-methyl-2-pyrrolidone (NMP) were added into a reaction bottle under nitrogen. Next, after cooling to 0° C. and stirring for 4 hours, 3-aminophenol (30 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (XIII) was obtained. Table 2 shows the components and the repeat unit ratio of the obtained polymer of Example 11. Finally, the inherent viscosity of the polymer of the polymer solution (XIII) was measured, and the inherent viscosity of the polymer is 0.23 dL/g.

Example 12

2,2-bis(3-amino-4-hydroxyphenyl) hexafluoropropane (BisAPAF) (52.5 mmol), 55-Amino-2-(4-aminophenyl)benzoxazole(5-ABO) (25 mmol), 1,3-bis(3-aminopropyl-1,1,3,3-tetramethyldisiloxane (siloxane 248) (10 mmol), and 4,4'-Oxydiphthalic dianhydride (ODPA, having a structure represented by

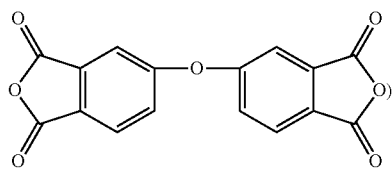

(100 mmol), and 200 g of N-methyl-2-pyrrolidone (NMP) were added into a reaction bottle under nitrogen. Next, after cooling to 0° C. and then stirring for 4 hours, 3-aminobenzoic acid (having a structure represented by

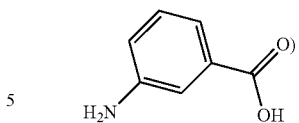

(25 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (XIV) was obtained. Table 2 shows the components and the repeat unit ratio of the obtained polymer of Example 12. Finally, the inherent viscosity of the polymer of the polymer solution (XIV) was measured, and the inherent viscosity of the polymer is 0.22 dL/g.

Example 13

2,2-bis(3-amino-4-hydroxyphenyl) hexafluoropropane (BisAPAF) (55 mmol), 55-Amino-2-(4-aminophenyl)benzoxazole(5-ABO) (20 mmol), 1,4-bis(4-aminophenoxy)benzene (TPE-Q, having a structure represented by

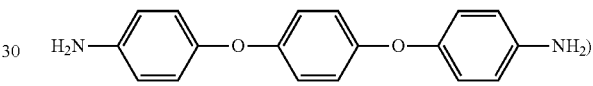

(10 mmol), and 4,4'-Oxydiphthalic dianhydride (ODPA, having a structure represented by

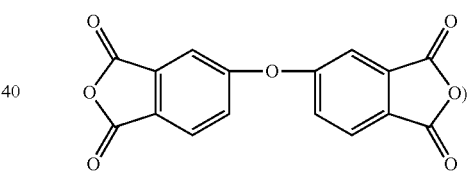

(100 mmol), and 200 g of N-methyl-2-pyrrolidone (NMP) were added into a reaction bottle under nitrogen. Next, after cooling to 0° C. and then stirring for 4 hours, 3-aminobenzoic acid (having a structure represented by

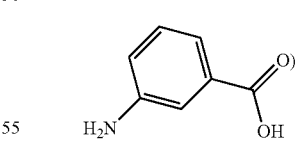

(30 mmol) serving as an end-capped agent was added into the reaction bottle, and then the mixture was stirred for 4 hours at room temperature. Next, 80 g of xylene was added into the reaction bottle, and the mixture was heated to 180° C. and stirred for 3 hours. After cooling, a sticky polymer solution (XV) was obtained. Table 2 shows the components and the repeat unit ratio of the obtained polymer of Example 13. Finally, the inherent viscosity of the polymer of the polymer solution (XV) was measured, and the inherent viscosity of the polymer is 0.19 dL/g.

TABLE 2

| | anhydride having a structure represented by Formula (II)/ mmol | diamine having a structure represented by Formula (III)/mmol | diamine having a structure represented by Formula (IV)/ mmol | 3-aminophenol (mmol) | m/(m + n) (corresponding to Formula (I)) |
|---|---|---|---|---|---|
| Example 8 | TMEG/100 | P-HAB/55 TFMB/10 | 5-ABO/20 | 30 | 0.235 |
| Example 9 | TMEG/100 | BisAPAF/55 BAPP/10 | 5-ABO/20 | 30 | 0.235 |
| Example 10 | ODPA/100 | BisAPAF/52.5 m-BAPS/10 | 5-ABO/25 | 25 | 0.285 |
| Example 11 | B1317/100 | BisAPAF/55 ODA/10 | 5-ABO/20 | 30 | 0.235 |

| | anhydride having a structure represented by Formula (II)/ mmol | diamine having a structure represented by Formula (III)/mmol | diamine having a structure represented by Formula (IV)/ mmol | 3-aminobenzoic acid (mmol) | m/(m + n) (corresponding to Formula (I)) |
|---|---|---|---|---|---|
| Example 12 | ODPA/100 | BisAPAF/52.5 siloxane 248/10 | 5-ABO/25 | 25 | 0.285 |
| Example 13 | ODPA/100 | BisAPAF/55 TPE-Q/10 | 5-ABO/20 | 30 | 0.235 |

Photosensitive Resin Composition

Example 14

50 g of polymer solution (I), 3.28 g of PAC-4 (having a structure represented by

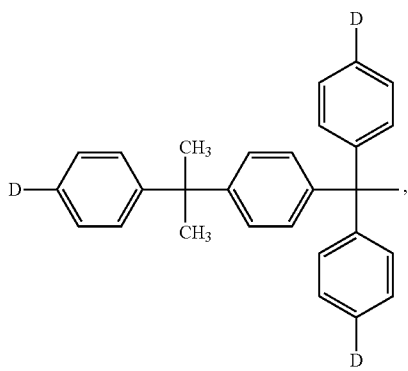 [SMILES: [2H]c1ccc(C(C)(C)c2ccc(C(C)(c3ccc([2H])cc3)c3ccc([2H])cc3)cc2)cc1]

wherein D is

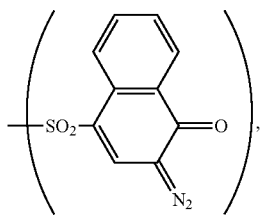

sold and manufactured by Sambo), and 1.96 g of 2,6-bis(hydroxymethyl)-p-cresol (DML-PC) were mixed, obtaining a photosensitive resin composition (I). Next, the photosensitive resin composition (I) was coated on a wafer via a spin coating process, and then pre-baked at 110° C. for 2 minutes, obtaining a layer with a thickness of 2 μm. Next, the layer was irradiated with a light (with a wavelengths of 250 nm-400 nm and having an energy of about 150 mJ/cm$^2$) from an un-filtered mercury arc lamp. Next, the layer was developed by 2.38 wt % tetramethylammonium hydroxide (TMAH) aqueous solution for 60 seconds. Next, the developed layer was subjected to a post-cure process in an oven at 230° C. for 60 minutes, obtaining a cured layer (I). The cured layer (I) was subjected to tests to determine the developability and chemical resistance, and the results are shown in Table 3. Test of developability: After development, the patterned layer was imaged by a scanning electron microscopy (SEM). When a remained photosensitive resin composition was observed in the SEM photography, the test was marked with X. Otherwise, it was marked with O. Test of chemical resistance: The cured layer was immersed in a resist remover solution TOK-106 (manufactured by Tokyo Ohka Kogyo Co., Ltd.) at 70° C. for 10 minutes, followed by washing with water. Thereafter, when a deformation of shape or a variation of thickness of the cured layer was observed, the test was marked with X. Otherwise, it was marked with O.

Example 15

The photosensitive resin composition of Example 15 was performed as the method as described in Example 14 except that the polymer solution (II) was substituted for the polymer solution (I), obtaining the photosensitive resin composition (II). Next, the cured layer of Example 15 was performed as the method as described in Example 14 except that the photosensitive resin composition (II) was substituted for the photosensitive resin composition (I), obtaining the cured layer (II). The cured layer (II) was subjected to the tests to determine the developability and chemical resistance, and the results are shown in Table 3.

Example 16

50 g of polymer solution (III), 3.12 g of PAC-4, and 1.875 g of 2,6-bis(hydroxymethyl)-p-cresol (DML-PC) were mixed, obtaining a photosensitive resin composition (III).

Next, the photosensitive resin composition (III) was coated on a wafer via a spin coating process, and then pre-baked at 110° C. for 2 minutes, obtaining a layer with a thickness of 2 μm. Next, the layer was irradiated with a light (with a wavelengths of 250 nm-400 nm and having an energy of about 150 mJ/cm$^2$) from an un-filtered mercury arc lamp. Next, the layer was developed by 2.38 wt % tetramethyl-ammonium hydroxide (TMAH) aqueous solution for 60 seconds. Next, the developed layer was subjected to a post-cure process in an oven at 230° C. for 60 minutes, obtaining a cured layer (III). The cured layer (III) was subjected to tests to determine the developability and chemical resistance, and the results are shown in Table 3.

Example 17-20

The photosensitive resin compositions of Examples 17-20 were performed as the method as described in Example 16 except that the polymer solutions (IV)-(VII) were substituted for the polymer solution (III) respectively, obtaining the photosensitive resin compositions (IV)-(VII). Next, the cured layers of Examples 17-20 were performed as the method as described in Example 16 except that the photosensitive resin compositions (IV)-(VII) was substituted for the photosensitive resin composition (III) respectively, obtaining the cured layers (IV)-(VII). The cured layers (IV)-(VII) were subjected to the tests to determine the developability and chemical resistance thereof, and the results are shown in Table 3.

Comparative Example 3

50 g of polymer solution (VIII), 3.4 g of PAC-4, and 2.03 g of 2,6-bis(hydroxymethyl)-p-cresol (DML-PC) were mixed, obtaining a photosensitive resin composition (VIII). Next, the photosensitive resin composition (VIII) was coated on a wafer via a spin coating process, and then pre-baked at 110° C. for 2 minutes, obtaining a layer with a thickness of 2 μm. Next, the layer was irradiated with a light (with a wavelengths of 250 nm-400 nm and having an energy of about 150 mJ/cm$^2$) from an un-filtered mercury arc lamp. Next, the layer was developed by 2.38 wt % tetramethylammonium hydroxide (TMAH) aqueous solution for 60 seconds. Next, the developed layer was subjected to a post-cure process in an oven at 230° C. for 60 minutes, obtaining a cured layer (VIII). The cured layer (VIII) was subjected to tests to determine the developability and chemical resistance, and the results are shown in Table 3.

Comparative Example 4

The photosensitive resin composition of Comparative Example 4 was performed as the method as described in Comparative Example 3 except that the polymer solution (IX) was substituted for the polymer solution (VIII), obtaining the photosensitive resin composition (IX). Next, the cured layer of Example 15 was performed as the method as described in Example 14 except that the photosensitive resin composition (IX) was substituted for the photosensitive resin composition (VIII), obtaining the cured layer (IX). The cured layer (IX) was subjected to the tests to determine the developability and chemical resistance, and the results are shown in Table 3.

TABLE 3

| | developability | chemical resistance | $m/(m+n)$ of polymer |
|---|---|---|---|
| Example 14 | ○ | ○ | 0.228 |
| Example 15 | ○ | ○ | 0.228 |
| Example 16 | ○ | ○ | 0.228 |
| Example 17 | ○ | ○ | 0.228 |
| Example 18 | ○ | ○ | 0.4 |
| Example 19 | ○ | ○ | 0.228 |
| Example 20 | ○ | ○ | 0.228 |
| Comparative Example 3 | ○ | X | 0 |
| Comparative Example 4 | X | ○ | 0.5 |

As shown in Table 3, when the m/(m+n) value of the polymer is between 0.1 and 0.4, the photosensitive resin composition employing the same polymer has a great developability (i.e. the coating of the photosensitive resin composition, which is not irradiated with a light (such as ultraviolet light), can be completely removed after development) and chemical resistance. Conversely, when the m/(m+n) value of the polymer is less than 0.1, the photosensitive resin composition employing the same polymer has poor chemical resistance. On the other hand, when the m/(m+n) value of the polymer is equal to or larger than 0.5, the photosensitive resin composition employing the same polymer has a poor operability and developability.

Examples 21-26

The photosensitive resin compositions of Examples 21-26 were performed as the method as described in Example 16 except that the polymer solutions (X)-(XV) were substituted for the polymer solution (III) respectively, obtaining the photosensitive resin compositions (X)-(XV). Next, the cured layers of Examples 21-26 were performed as the method as described in Example 16 except that the photosensitive resin compositions (X)-(XV) were substituted for the photosensitive resin composition (III) respectively, obtaining the cured layers (X)-(XV). The cured layers (X)-(XV) were subjected to the tests to determine the developability and chemical resistance thereof, and the results are shown in Table 4.

TABLE 4

| | developability | chemical resistance | $m/(m+n)$ of polymer |
|---|---|---|---|
| Example 21 | ○ | ○ | 0.235 |
| Example 22 | ○ | ○ | 0.235 |
| Example 23 | ○ | ○ | 0.285 |
| Example 24 | ○ | ○ | 0.235 |
| Example 25 | ○ | ○ | 0.285 |
| Example 26 | ○ | ○ | 0.235 |

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A polymer, having a structure represented by Formula (I):

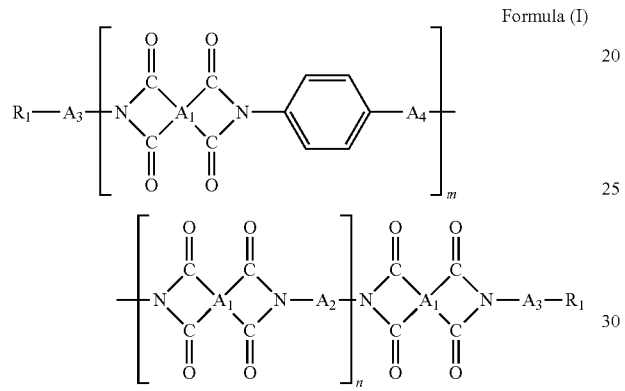

wherein, $R_1$ is —OH, or —COOH; $A_1$ is

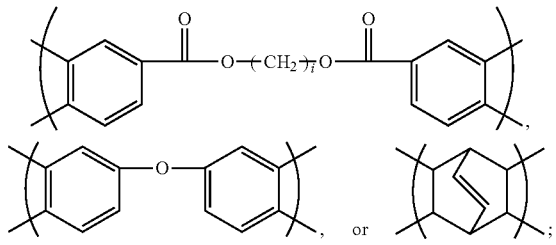

each $A_2$ is independently

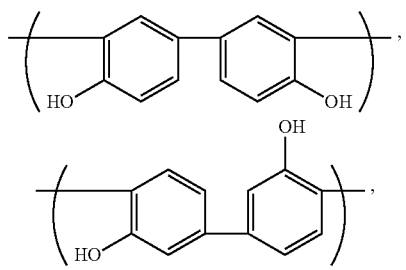

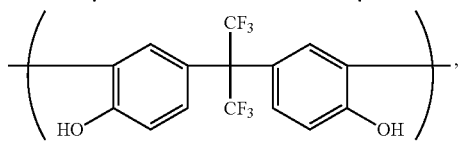

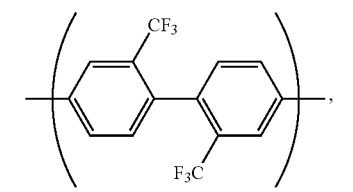

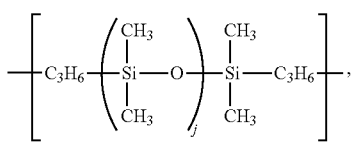

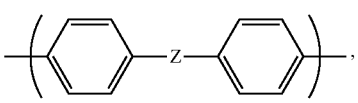

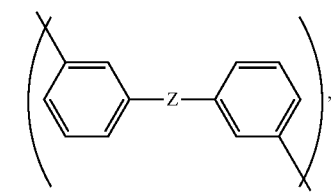

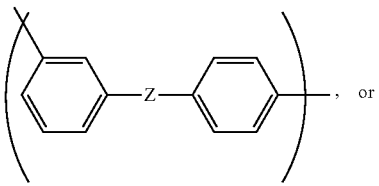

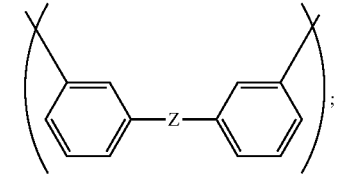

each $A_3$ is independently

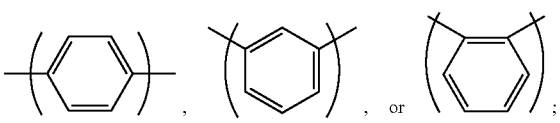

$A_4$ is

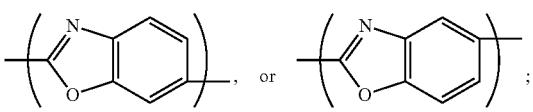

Z is —O—, —SO$_2$—, —C(CH$_3$)$_2$—, —C(CF$_3$)$_2$—,

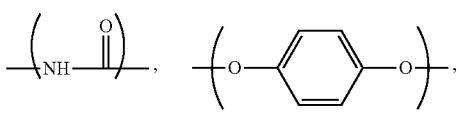

-continued

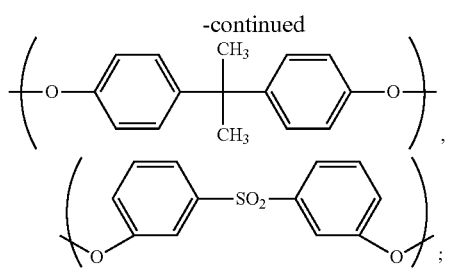, or m is a positive integer that is greater than 1; n is a positive integer that is greater than 1; i is a positive integer between 1 and 3; and, j is a positive integer between 1 and 20; and the repeat units represented by

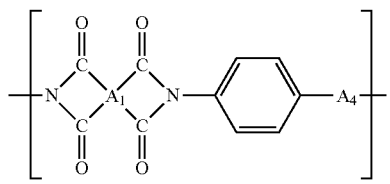

and the repeat units represented by

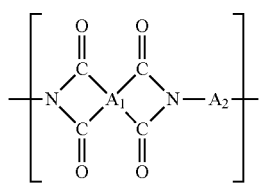

are arranged in a random fashion.

2. The polymer as claimed in claim 1, wherein m/(m+n) is between 0.05 and 0.9.

3. The polymer as claimed in claim 1, wherein m/(m+n) is between 0.1 and 0.4.

4. A method for preparing the polymer as claimed in claim 1, comprising:
subjecting a composition to a polymerization, obtaining the polymer as claimed in claim 1, wherein the composition comprises an anhydride having a structure represented by Formula (II), a diamine having a structure represented by Formula (III), a diamine having a structure represented by Formula (IV), and a compound having a structure represented by Formula (V)

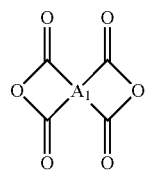     Formula (II)

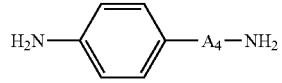     Formula (III)

$H_2N-A_2-NH_2$     Formula (IV)

$H_2N-A_3-R_1$     Formula (V)

wherein, $R_1$ is —OH, or —COOH;

$A_1$ is

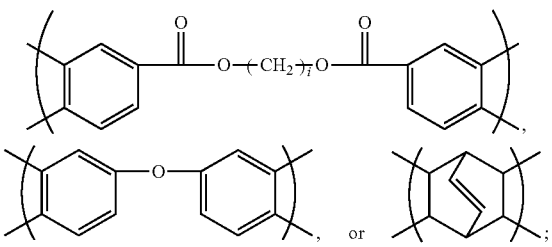

$A_2$ is

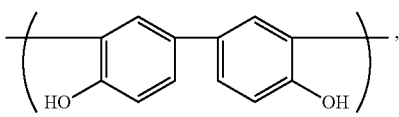

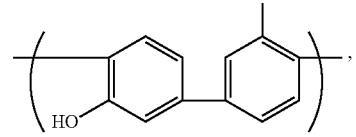

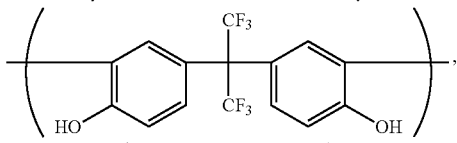

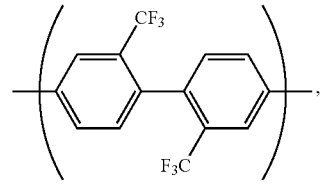

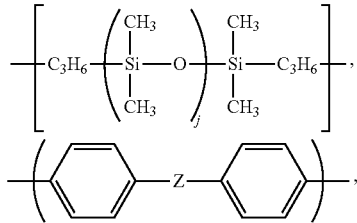

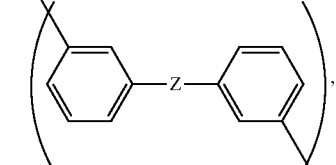

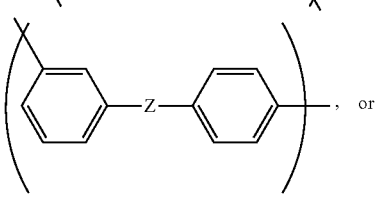, or

-continued

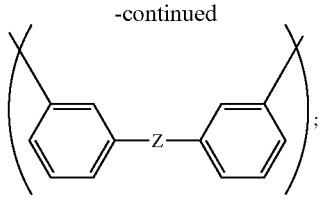

$A_3$ is

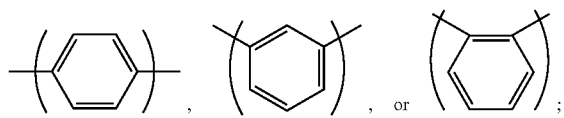

$A_4$ is

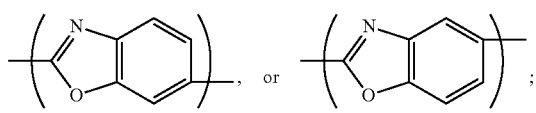

Z is —O—, —SO$_2$—, —C(CH$_3$)$_2$—, —C(CF$_3$)$_2$—,

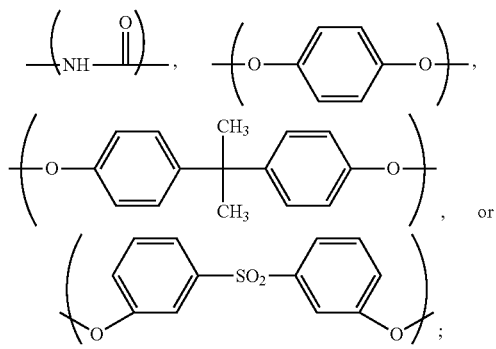

i is a positive integer between 1 and 3; and, j is a positive integer between 1 and 20.

5. The method as claimed in claim 4, wherein the composition comprises 1 part by mole of the anhydride having a structure represented by Formula (II), 0.2-0.5 parts by mole of the diamine having a structure represented by Formula (III), 0.4-0.9 parts by mole of the diamine having a structure represented by Formula (IV), and 0.1-0.4 parts by mole of the compound having a structure represented by Formula (V).

6. The method as claimed in claim 4, wherein the ratio between the sum of the moles of the diamines having structures represented by Formula (III) and Formula (IV) and one-half of the moles of the compound having a structure represented by Formula (V) to the moles of the anhydride having a structure represented by Formula (II) is from 0.7 to 1.6.

7. The method as claimed in claim 4, wherein the ratio between the sum of the moles of the diamines having structures represented by Formula (III) and Formula (IV) and one-half of the moles of the compound having a structure represented by Formula (V) to the moles of the anhydride having a structure represented by Formula (II) is from 0.8 to 1.2.

8. The method as claimed in claim 4, wherein the ratio between the moles of the diamine having a structure represented by Formula (III) to the sum of the moles of the diamines having structures represented by Formula (III) and Formula (IV) is from 0.05 to 0.9.

9. The method as claimed in claim 4, wherein the ratio between the moles of the diamine having a structure represented by Formula (III) to the sum of the moles of the diamines having structures represented by Formula (III) and Formula (IV) is from 0.1 to 0.4.

10. The method as claimed in claim 4, wherein the mole ratio between the compound having a structure represented by Formula (V) to the anhydride having a structure represented by Formula (II) is from 0.1 to 0.3.

11. A photosensitive resin composition, comprising components (A)-(C) uniformly distributed in a solvent:
   (A) the polymer as claimed in claim 1;
   (B) a compound having a phenyl group; and
   (C) a photosensitive agent.

12. The photosensitive resin composition as claimed in claim 11, wherein the photosensitive resin composition comprises 100 parts by weight of (A) the polymer, 1-50 parts by weight of (B) the compound, and 1-50 parts by weight of (C) the photosensitive agent.

13. The photosensitive resin composition as claimed in claim 11, wherein (B) the compound is

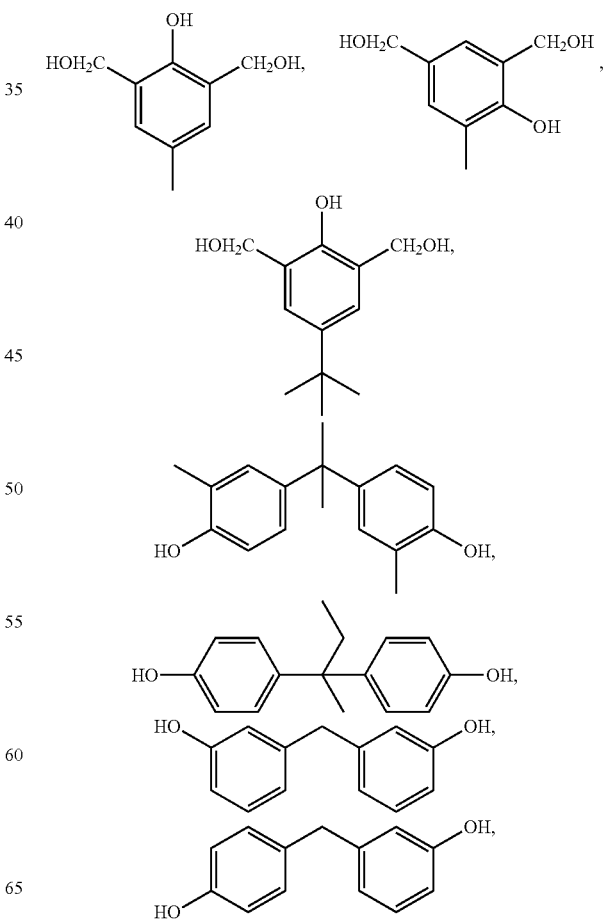

-continued

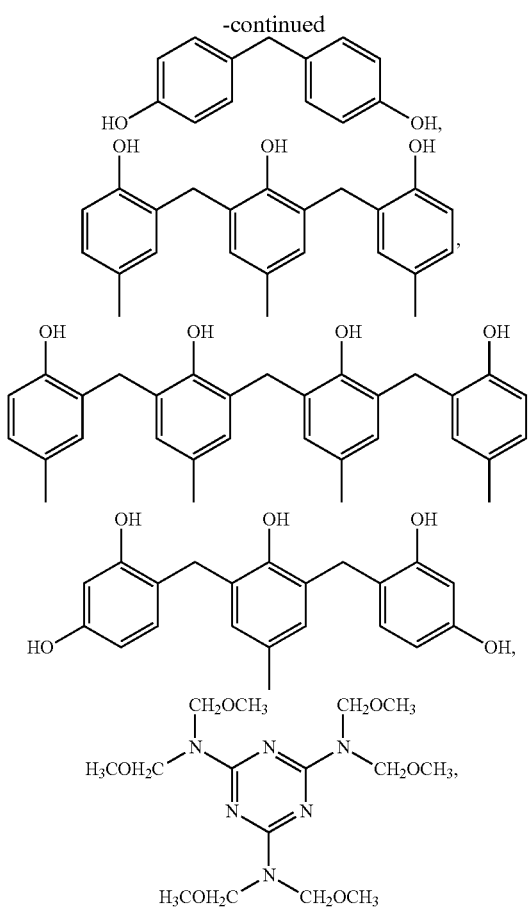

or a combination thereof.

14. The photosensitive resin composition as claimed in claim 11, wherein (C) the photosensitive agent comprises quinonediazide sulfonate.

15. The photosensitive resin composition as claimed in claim 11, wherein (C) the photosensitive agent is

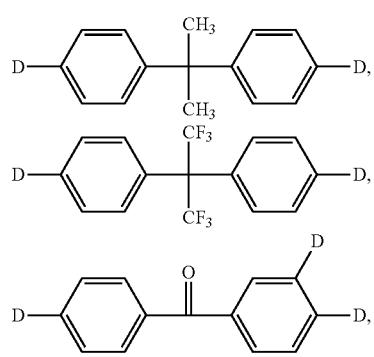

-continued

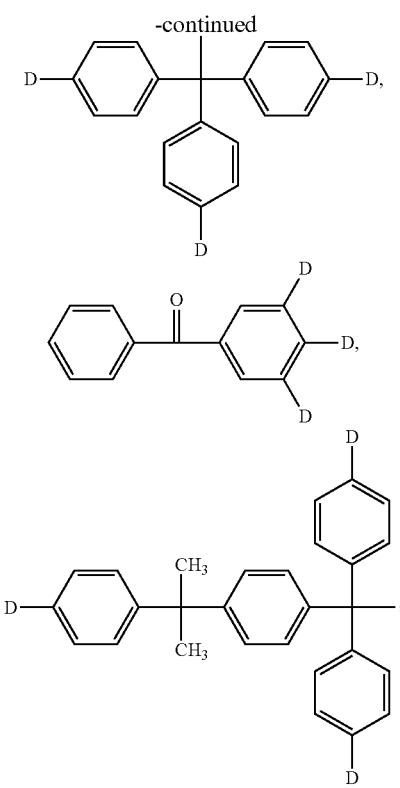

or a combination thereof, wherein D is independently —OH,

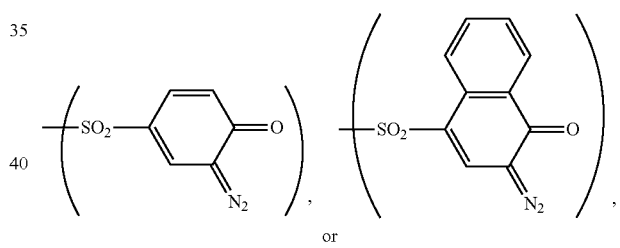

or

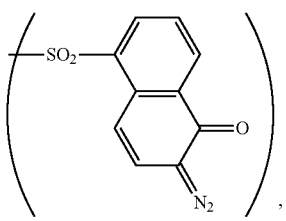

and at least one of D is not —OH.

16. The photosensitive resin composition as claimed in claim 11, wherein the solvent is N-methyl-2-pyrrolidone, γ-butyrolactone, or a combination thereof.

* * * * *